US011148286B2

(12) United States Patent
Aukes et al.

(10) Patent No.: US 11,148,286 B2
(45) Date of Patent: Oct. 19, 2021

(54) SYSTEMS AND METHODS FOR RAPID-PROTOTYPED ROBOTIC DEVICES

(71) Applicants: Daniel M. Aukes, Gilbert, AZ (US); Hani Ben Amor, Tempe, AZ (US); Kevin Luck, Tempe, AZ (US); Michael Jansen, Tempe, AZ (US); Joseph Campbell, Chandler, AZ (US)

(72) Inventors: Daniel M. Aukes, Gilbert, AZ (US); Hani Ben Amor, Tempe, AZ (US); Kevin Luck, Tempe, AZ (US); Michael Jansen, Tempe, AZ (US); Joseph Campbell, Chandler, AZ (US)

(73) Assignee: Arizona Board of Regents on Behalf of Arizona State University, Tempe, AZ (US)

(*) Notice: Subject to any disclaimer, the term of this patent is extended or adjusted under 35 U.S.C. 154(b) by 324 days.

(21) Appl. No.: 16/215,910

(22) Filed: Dec. 11, 2018

(65) Prior Publication Data

US 2019/0176324 A1    Jun. 13, 2019

Related U.S. Application Data

(60) Provisional application No. 62/597,276, filed on Dec. 11, 2017.

(51) Int. Cl.
| | |
|---|---|
| *B25J 9/16* | (2006.01) |
| *B25J 9/00* | (2006.01) |
| *B29C 64/379* | (2017.01) |
| *B29C 64/147* | (2017.01) |
| *B25J 19/00* | (2006.01) |
| *G06F 30/17* | (2020.01) |

(52) U.S. Cl.
CPC ............ *B25J 9/163* (2013.01); *B25J 9/0009* (2013.01); *B25J 9/0015* (2013.01); *B25J 9/1682* (2013.01); *B25J 19/007* (2013.01); *B29C 64/147* (2017.08); *B29C 64/379* (2017.08); *G06F 30/17* (2020.01)

(58) Field of Classification Search
CPC ...................................................... B25J 9/163
See application file for complete search history.

(56) References Cited

U.S. PATENT DOCUMENTS

| | | | | |
|---|---|---|---|---|
| 2010/0076598 A1* | 3/2010 | Herbert | ................. | B62D 57/02 700/245 |
| 2016/0040657 A1* | 2/2016 | Felton | .................... | B32B 3/266 60/527 |
| 2019/0225335 A1 | 7/2019 | Zhang et al. | | |

OTHER PUBLICATIONS

Hester, Todd; Stone, Peter. "TEXPLORE: real-time sample-efficient reinforcement learning for robots". Oct. 24, 2012. (Year: 2012).*
Mazouchova, Nicole; Umbanhowar, Paul B.; Goldman, Daniel I. "Flipper-driven terrestrial locomotion of a sea turtle-inspired robot". Apr. 23, 2013. (Year: 2013).*
Matta, Alexander; Pendar, Hodjat; Bayandor, Javid. "A preliminary investigation of caudal fin shape effects on thrust and power of a newly designed robotic tuna". Aug. 3, 2017. (Year: 2017).*

(Continued)

*Primary Examiner* — Jeff A Burke
*Assistant Examiner* — Madison B Emmett
(74) *Attorney, Agent, or Firm* — Polsinelli PC

(57) ABSTRACT

Various embodiments for fast prototyping of morphologies and controllers related to locomotion for a robotic device are disclosed.

20 Claims, 16 Drawing Sheets
(15 of 16 Drawing Sheet(s) Filed in Color)

(56) References Cited

OTHER PUBLICATIONS

Siegenthaler, Cedric; Pradalier, Cedric; Gunther, Fabian; Hitz, Gregory; Siegwart, Roland. "System integration and fin trajectory design for a robotic sea-turtle". Nov. 2013. (Year: 2013).*
Mnih, et al., Human-level control through deep reinforcement learning. Nature, 518(7540):529-533, Feb. 2015.
Playter, et al., BigDog. Unmanned Ground Vehicle Technology VIII, vol. 6230 of Proceedings of SPIE, pp. 6230201-6230206, 2006.
Pritchard, et al., Taxonomy, external morphology, and species identification. Research and management techniques for the conservation of sea turtles, 4:21, 1999.
Renous (1993) Comparison between aquatic and terrestrial locomotions of the leatherback sea turle (*Dermochelys coriacea*). Journal of Zoology 230(3):357-378.
Smith, et al., (1946) Observations of behavioral development in the loggerhead turtle *Caretta caretta*). Science.
Sreetharan, et al., Monolithic fabrication of millimeter-scale machines. Journal of Micromechanics and Micro-engineering, 22(5):055027, May 2012. ISSN 0960-1317.
Tesch, et al., Parameterized and scripted gaits for modular snake robots. Advanced Robotics, 23(9): 1131-1158, 2009.
Umedachi, et al., (2016) Softworms : the design and control of non-pneumatic, 3D-printed, deformable robots. Bioinspiration & Biomimetics 11(2):025,001.
Whitney, et al., Pop-up book MEMS. Journal of Micromechanics and Microengineering, 21 (11): 115021, Nov. 2011. ISSN 0960-1317.
Wood, et al., Microrobot Design Using Fiber Reinforced Composites. Journal of Mechanical Design, 130(5):052304, 2008. ISSN 10500472.
Wyneken, Sea turtle locomotion: Mechanics, behavior, and energetics. In Peter L Lutz, editor, The Biology of Sea Turtles, pp. 168-198. CRC Press, 1997.
Yao, et al., Development of a turtle-like underwater vehicle using central pattern generator. In Robotics and Biomimetics (ROBIO), 2013 IEEE International Conference on, pp. 44-49. IEEE, 2013.
Zug, et al., (1996) Age and growth in leatherback turtles, *Dermochelys coriacea* (testudines: Dermochelyidae): a skeletochronological analysis. Chelonian Conservation and Biology 2:244-249.
Altendorfer et al., (2001) RHex: a biologically inspired hexapod runner. Autonomous Robots 11(3):207-213.
Askari, et al., Intrusion rheology in grains and other flowable materials. Nature Materials, 15(12): 1274-1279, 2016.
Autumn, et al., (2006) Frictional adhesion: A new angle on gecko attachment. The Journal of experimental biology 209 (Pt 18):3569-79.
Bhushan. Biomimetics: Lessons from nature—an overview. Philosophical Transactions of the Royal Society A Mathematical, Physical and Engineering Sciences, 367(1893):1445-1486, 2009.

Birkmeyer, et al., (2009) DASH: A dynamic 16g hexapedal robot. 2009 IEEE/RSJ International Conference on Intelligent Robots and Sys-tems pp. 2683-2689.
Cham, et al., (2002) Fast and Robust: Hexapedal Robots via Shape Deposition Manufacturing. The International Journal of Robotics Research 21(10-11):869-882.
Clark, et al., Biomimetic design and fabrication of a hexapedal running robot. In Proceedings of IEEE International Conference on Robotics and Automation, vol. 4, pp. 3643-3649, 2001.
Dodd Jr., Synopsis of the biological data on the loggerhead sea turtle *Caretta caretta* (linnaeus 1758). Technical report, DTIC Document, 1988.
Eckert, et al., Death of a giant. Marine Turtle Newsletter, 43:2-3, 1988.
Gollnick, et al., An Introduction to Multilayer Lamina Emergent Mechanisms. Journal of Mechanical Design, 133(8): 081006, 2011. ISSN 10500472.
Holmes, et al., The dynamics of legged locomotion: Models, analyses, and challenges. Siam Review, 48(2): 207-304, 2006.
Hoover, et al., (2008) RoACH: An autonomous 2.4g crawling hexapod robot. In: 2008 IEEE/RSJ International Conference on Intelligent Robots and Systems, IEEE, pp. 26-33.
Ijspeert (2014) Biorobotics: Using robots to emulate and investigate agile locomotion. Science 346(6206): 196-203.
Kim, et al., (2008) Smooth vertical surface climbing with directional adhesion. IEEE Transactions on Robotics 24 (1):65-74.
Kingsley, et al., (2006) A Cockroach Inspired Robot With Artificial Muscles. In: 2006 IEEE/RSJ International Conference on Intelligent Robots and Systems, IEEE, pp. 1837-1842.
Krouchev, et al., Sequential activation of muscle synergies during locomotion in the intact cat as revealed by cluster analysis and direct decomposition. Journal of Neurophysiology, 96(4):1991-2010, 2006. ISSN 0022-3077.
Li, et al., A terradynamics of legged locomotion on granular media. Science, 339:1408-1412, 2013.
Low, et al., Modular design and initial gait study of an amphibian robotic turtle. In Robotics and Biomimetics, 2007. ROBIO 2007. IEEE International Conference on, pp. 535-540. IEEE, 2007.
Luck, et al., (2017) From the Lab to the Desert: Fast Prototyping and Learning of Robot Locomotion. Robotics Science and Systems Conference (RSS2017) (Submitted).
Luck, et al., Sparse latent space policy search. In AAAI, pp. 1911-1918, 2016.
Ma, et al., Controlled flight of a biologically inspired, insect-scale robot. Science, 340(6132):603-607, 2013.
Maladen, et al., Undulatory swimming in sand: subsurface locomotion of the sandfish lizard. science, 325(5938): 314-318, 2009.
Mazouchov, et al., Flipper-driven terrestrial locomotion of a sea turtle-inspired robot. Bioinspiration and Biomimetics, 8(2):026007, 2013.
Mazouchova, et al., Utilization of granular solidification during terrestrial locomotion of hatchling sea turtles. Biology Letters, 6:398-401, 2010.

* cited by examiner

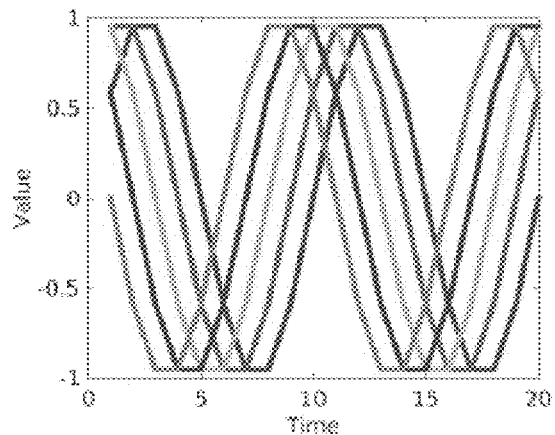
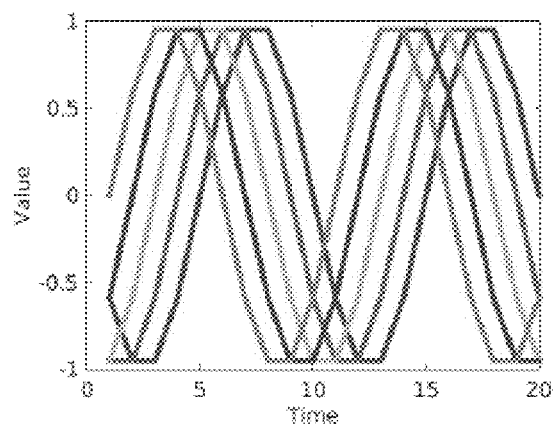
FIG. 4A
FIG. 4B
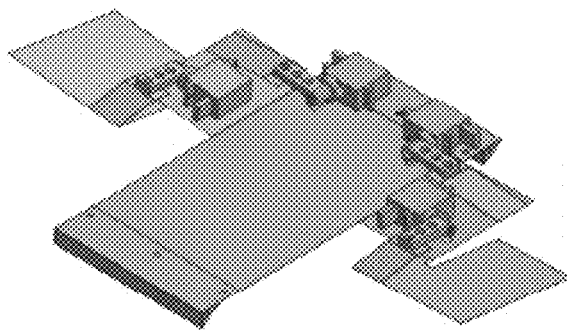
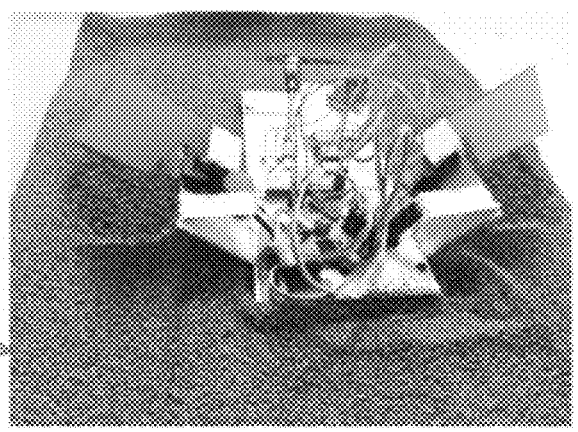
FIG. 5A
FIG. 5B

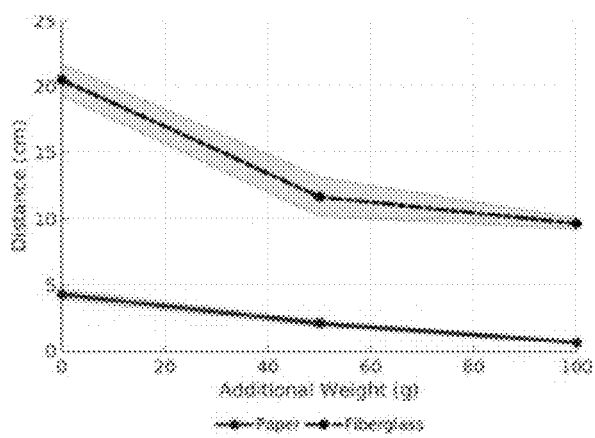 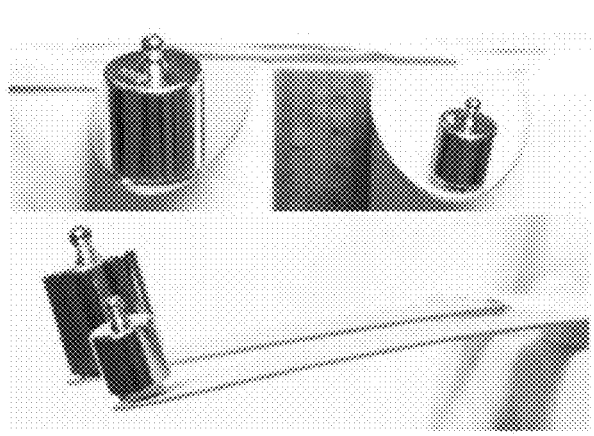
FIG. 20A                    FIG. 20B

SYSTEMS AND METHODS FOR RAPID-PROTOTYPED ROBOTIC DEVICES

CROSS REFERENCE TO RELATED APPLICATIONS

This is a non-provisional application that claims benefit to U.S. provisional application Ser. No. 62/697,276 filed on Dec. 11, 2017, and is herein incorporated by reference in its entirety.

FIELD

The present disclosure generally relates to robotic devices and in particular to systems and methods for rapid-prototyped terrestrial robotic devices.

BACKGROUND

Robots are often tasked with operating in challenging environments that are difficult to model accurately. Search-and-rescue or space exploration tasks, for example, require robots to navigate through loose, granular media of varying density and unknown composition, such as sandy desert environments. A common approach is to use simulations in order to develop ideal locomotion strategies before deployment. Such an approach, however, requires prior knowledge about ground composition which may not be available or may fluctuate significantly. In addition, the sheer complexity of such terrain necessitates the use of approximations when simulating interactions between the robot and its environment. However, inaccuracies inherent to approximations can lead to substantial discrepancies between simulated and real-world performance. These limitations are especially troublesome as robot design is also guided by simulations in order to overcome time constraints and material deterioration associated with traditional physical testing.

The use of robotics to answer questions in biology is a well-established paradigm which offers benefits to both fields. For biologists, the ability to study repeatable physical systems is an attractive option, even if such systems replicate only a small part of the biological analog. Robotic platforms can be modified quickly to test a wide range of morphologies and behaviors, and sensors can be mounted both in-situ and in the surrounding environment to determine the effect of morphological and behavioral changes on the body and to the world. Such platforms have made it possible to understand more about the locomotion of caterpillars, geckos, and sea-turtles, to name a small selection.

For roboticists, such collaborations offer insights into robotic design strategies that take into account knowledge of how species' adaptations make them suited for certain activities or environments. Many have found that such insights successfully transfer to robotic designs inspired by, for example, cockroaches, geckos, bees, and sea turtles. Such insights lead both to improved robotic designs and to a better understanding of biological systems.

These studies are often made possible through technological and manufacturing innovations which facilitate the rapid design and fabrication of robotic systems. Many of the platforms cited above make use of rapid prototyping techniques such as 3D printing, multi-material laminate fabrication processes, or iterative processes such as Shape Deposition Manufacturing (SDM). Such methods enable the manufacturing of monolithic systems where sub-components exhibit vastly different material properties and performance due to the targeted placement of rigid and soft materials.

It is with these observations in mind, among others, that various aspects of the present disclosure were conceived and developed.

BRIEF DESCRIPTION OF THE DRAWINGS

The present patent or application file contains at least one drawing executed in color. Copies of this patent or patent application publication with color drawing(s) will be provided by the Office upon request and payment of the necessary fee.

FIGS. 4A and 4B are graphical representations of sinusoidal basis functions $\varphi(t)$, according to aspects of the present disclosure;

FIG. 5A is a perspective view of the robotic device and FIG. 5B is a picture showing the robotic device buried in sand during motion, according to aspects of the present disclosure;

FIG. 20A is a graphical representation of an evaluation of the performance of rigid fins and flexible fins; FIG. 20B is a picture of fiberglass reinforced fins and paper fins with the same bending radius for 100 grams and 20 grams, respectively, according to aspects of the present disclosure.

Corresponding reference characters indicate corresponding elements among the view of the drawings. The headings used in the figures do not limit the scope of the claims.

DETAILED DESCRIPTION

Robotic devices are often tasked with operating in challenging environments that are difficult to accurately model. Search-and-rescue or space exploration tasks, for example, require robots to navigate through loose, granular media of varying density and unknown composition, such as sandy desert environments. A common approach is to use simulations in order to develop ideal locomotion strategies before deployment. Such an approach, however, requires prior knowledge about ground composition which may not be available or may fluctuate significantly. In addition, the sheer complexity of such terrain necessitates the use of approximations when simulating interactions between the robotic device and its environment. However, inaccuracies inherent to approximations can lead to substantial discrepancies between simulated and real-world performance. These limitations are especially troublesome as robotic design is also guided by simulations in order to overcome time constraints and material deterioration associated with traditional physical testing.

In the present disclosure, the design of effective locomotion strategies is dependent on the interplay between (a) the shape of the robotic device, (b) the behavioral and adaptive capabilities of the robotic device, and (c) the characteristics of the environment. In particular, adverse and dynamic terrains require a design process in which both form and function of a robotic device can be rapidly adapted to numerous environmental constraints. To this end, the present disclosure introduces a novel methodology employing a combination of fast prototyping and manufacturing with sample-efficient reinforcement, thereby enabling practical, physical testing-based design for a robotic device.

Figure 1:
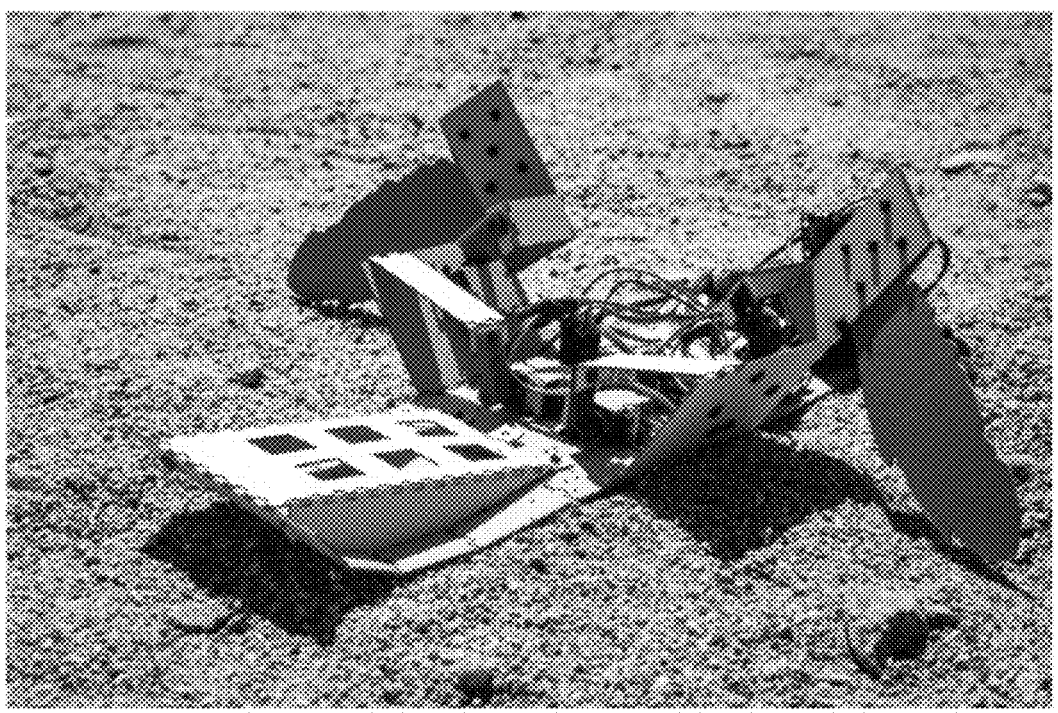
FIG. 1 is a picture of an embodiment of a robotic device manufactured from a multi-layer composite, according to aspects of the present disclosure.

First, a manufacturing process is described in which foldable robotic devices (FIG. 1) are constructed out of a single planar shape consisting of multiple laminated layers of material. The overall production time of a robotic device using this manufacturing method is in the range of a few hours, i.e., from the first laser-cut to the deployment. As a result, changes to the robotic shape can be performed by quickly iterating over several low-cost design cycles.

In addition to rapid design refinement and iteration, the synthesis of effective robot control policies is also of vital importance. Variations in terrain, the assembly process, motor properties, and other factors can heavily influence the optimal locomotion policy. Manual coding and adaptation of control policies is, therefore, a laborious and time-intensive process which may have to be repeated whenever the robot or terrain properties change, especially drift in actuation or changes in media granularity. Reinforcement Learning (RL) methods are a potential solution to this problem. Using a trial-and-error process, RL methods explore the policy space in search of solutions that maximize the expected reward, e.g., the distance traveled while executing the policy. However, RL algorithms typically require thousands or hundreds of thousands of trials before they converge on a suitable policy. Performing large numbers of experiments on a physical robotic device causes wear-and-tear on hardware, leads to drift in sensing and actuation, and may require extensive human involvement. This severely limits the number of learning experiments that can be performed within a reasonable amount of time.

A key element of this approach is a sample-efficient RL method which is used for swift learning and adaptation whenever the changes occur to the robotic device or the environment. By leveraging the low-dimensional nature and periodicity of locomotion gaits, effective control policies can be rapidly synthesized that are best adapted to the current terrain. Using the present method, the learning process quickly converges towards appropriate policy parameters. This translates to learning times of about 2-3 hours on the physical robotic device.

The present methodology is leveraged to conduct an extensive robotic device learning experiment. A low-cost crawler robotic device with variable, interchangeable fins has been designed. Learning is performed with different bio-inspired and original fin designs in both an indoor, artificial environment, as well as a natural environment in the Arizona desert. The findings of this experiment indicate that artificial environments consisting of poppy seeds, plastic granulates or other popular loose media substitutes may be a poor replacement for true environmental conditions. Hence, even policies that are not learned in simulation, but rather on granulate substitutes in the lab may not translate to reasonable locomotion skills in the real-world. In addition, experimental findings show that reinforcement learning is a crucial component in adapting and coping with variability in the environment, the robotic device, and the manufacturing process.

Thus, the present disclosure demonstrates that the combination of a rapid proto-typing process for robotic device design (form) and the fast learning of robot policies (function) enable environment-adaptive robot locomotion.

Methodology

A methodology for fast robot prototyping and learning as well as a sample-efficient reinforcement learning method is discussed herein that enables fast learning of new locomotion skills. In combination with a laminate robotic device manufacturing process, the present method allows for rapid iterations over both form and function of a robot. The main rationale behind this approach is that environmental conditions are often hard to reproduce outside of the natural application domain. Hence, the development cycle should be informed by experiences in the real application domain, e.g., on challenging terrain such as desert environments. The present approach facilitates this process and significantly reduces the underlying development time. Consequently, the methodology will be described for prototyping form and function in greater detail.

FORM: Laminate Robot Manufacturing

Figure 3:
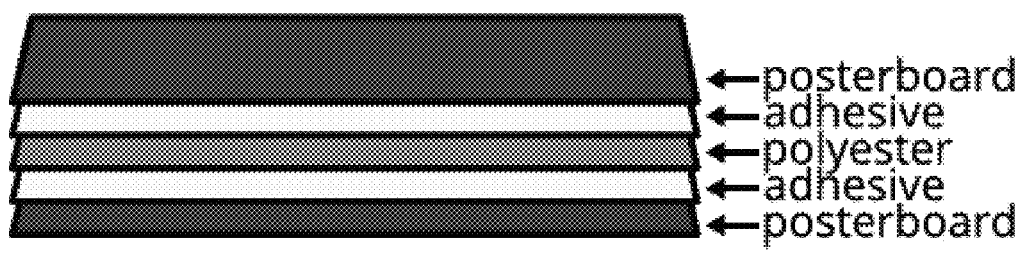
FIG. 3 is an illustration showing the laminates used to construct the robotic device, according to aspects of the present disclosure.
Figure 6A:
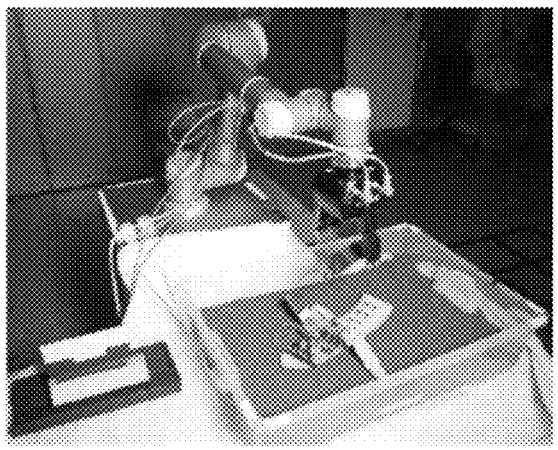
FIGS. 6A-6D are pictures showing a sequence of actions as a robotic arm of the robotic device executes in each learning cycle, according to aspects of the present disclosure.
Figure 6B:
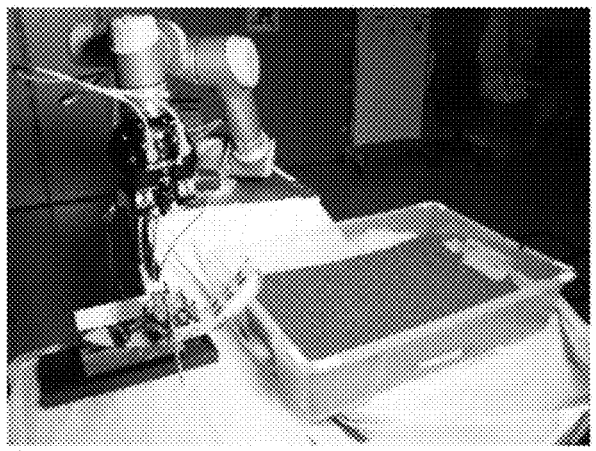
Figure 6C:
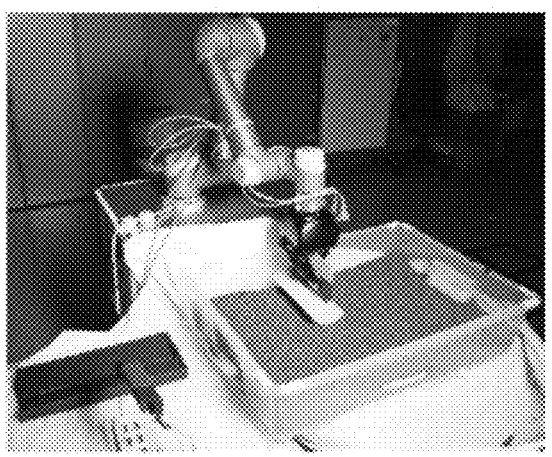
Figure 6D:
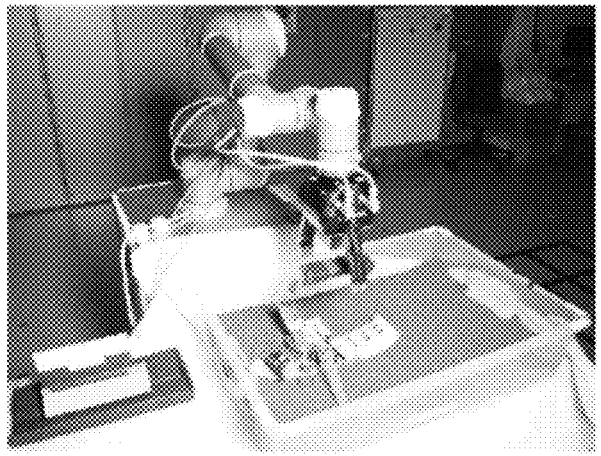
Figure 7A:
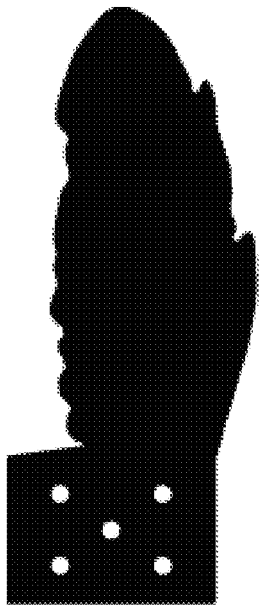
FIGS. 7A-7D show different designs of fins used by the robotic device, according to aspects of the present disclosure.
Figure 7B:
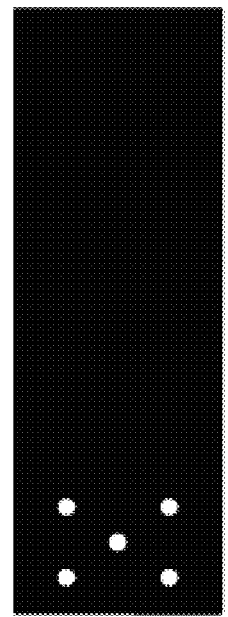
Figure 7C:
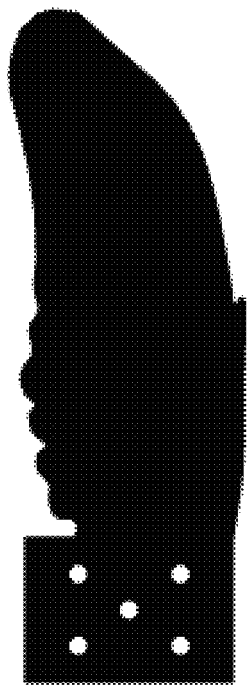
Figure 7D:
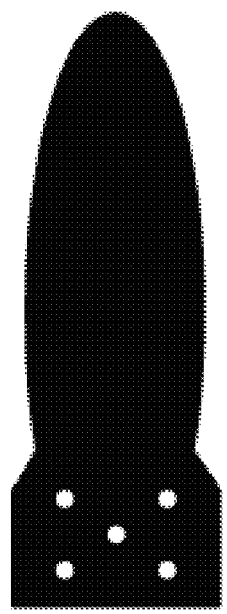

The laminate mechanisms (e.g., robotic devices) discussed herein were printed in five layers. As shown in FIG. 3, two rigid layers of 1 mm-thick poster-board are sandwiched around two adhesive layers of Drytac MHA heat-activated acrylic adhesive, which is sandwiched around a single layer of 50 Am-thick polyester film from McMaster-Carr. Flat sheets of each material are cut out on a laser cutter, then stacked and aligned using a jig with holes pre-cut in the first pass of the laser cut. Once aligned, these layers are fused together using a heated press in order to create a single laminate. The adhesive cures at around 85-104 degrees Celsius, and comes with a paper backing which allows it to be cut, aligned with the poster-board, and laminated. The paper backing is then removed, and the two adhesive-mounted poster-board layers are aligned with the center layer of polyester and laminated again. This laminate is returned to the laser, where a second release cut permits the device to be separated from surrounding scrap material and erected into a final three-dimensional configuration.

Figure 2A:
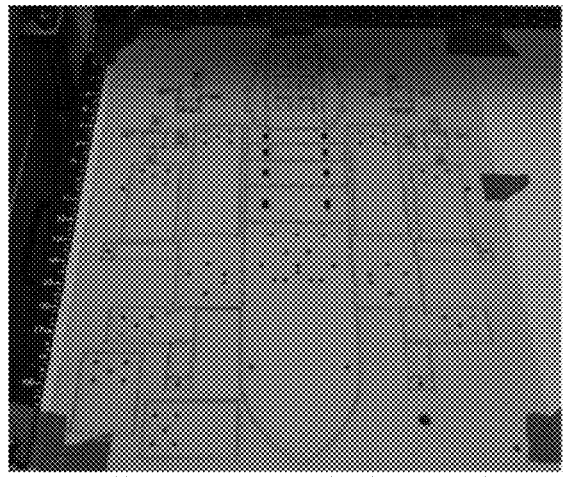
FIG. 2A is an illustration showing robot device components using a laser cutter on planar sheets and later laminated, according to aspects of the present disclosure.
Figure 2B:
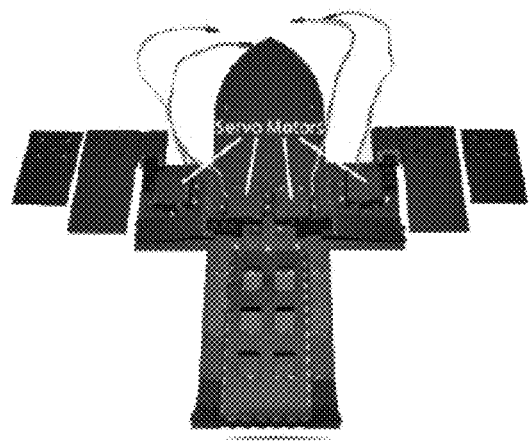
FIG. 2B is an exploded view of the robotic device components folded into a robot structure.
Figure 2C:
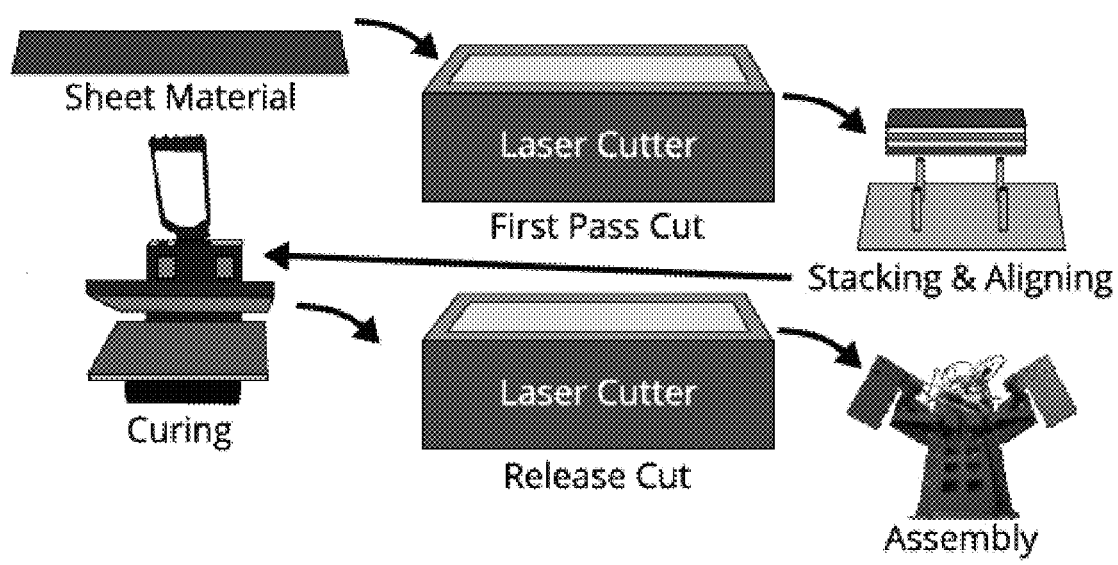
FIG. 2C is an illustration showing the full fabrication process of the robotic device, according to aspects of the present disclosure.

Laminate mechanisms resulting from this process are capable of a high degree of precision through bending of flexure-based hinges created through the selective removal of rigid material along desired bend axes. With fewer rolling contacts (bearings) than would typically be found in traditional robots, laminate mechanisms are ideal in sandy environments, where sand infiltration can shorten service life. Connections between layers can be established through adhesive layers, in addition to plastic rivets which permit quick attachment between laminates. Mounting holes permit attaching a variety of off-the-shelf components including motors, micro-controllers, and sensors. Rapid attachment/detachment is a highly desired feature for this platform, as different flipper designs can be tested using the same base platform. In all, this fabrication method permits rapid iteration during the design phase, and rapid re-configuration for testing a variety of designs across a wide range of force and length scales, due to its compatibility with a wide range of materials. FIG. 2A depicts the basic planar sheets after cutting and FIG. 2B shows the individual components of the robotic device after being detached from the sheets and folded into a structure. FIG. 2C illustrates the full fabrication process. The whole manufacturing process of one robotic device can take up to 50 minutes, while the 3D-printing process of four horns, which serve as connections between the motors and the paper, took 58 minutes.

FUNCTION: Sample-Efficient Reinforcement Learning

A sample-efficient RL method is discussed herein that converges on optimal locomotion policies within a small number of robot trials. The present approach leverages two key insights about human and animal locomotion. In particular, locomotion is (a) inherently low-dimensional and based on a small number of motor synergies, as well as (b) highly periodic in nature.

To implement these insights within a reinforcement learning framework, the Group Factor Policy Search (GrouPS) algorithm introduced by Luck et al. is built upon. GrouPS jointly searches for a low-dimensional control policy as well as a projection matrix W for embedding the results into a high-dimensional control space. It was previously shown that the algorithm is able to uncover optimal policies after a few iterations with only hundreds of samples. Group Factor Policy Search models the joint action as $a_t^{(m)} = (W^{(m)}Z + M^{(m)} + E^{(m)}) \varphi(s,t)$ for each time step t of a trajectory and each m-th group of actions. The matrix W represents the transformation matrix from the low dimensional to the high dimensional space (exploitation) and M the parameters of the current mean policy. The entries of the matrices Z and E are Gaussian distributed with $z_{ij} \sim N(0,1)$ for the latent values and $e_{ij} N(0, T_m^{-1})$ for the isotropic exploration. The function $\varphi(s,t)$ consists of basis functions $\varphi_t(s,t)$ and depends in the experiments only of the time step t and not of the full state s. In contrast to the prior art, however, periodicity constraints are incorporated the search process by focusing on periodic feature functions. Periodic basis functions are used over 20 time steps for the control signal as shown in FIG. 4. Given a point in time t the present system computes each control dimension $a_i$ by:

Given a point in time $t$ we compute each control dimension $a_i$ by $$a_i = \sum_j (\tilde{w}_{ij} + m_{ij} + e_{ij}) \sin\left(\frac{t}{T} 720° + \frac{j-1}{J} 360°\right) \quad (1)$$

with $\tilde{w}_{ij} = \sum_k w_{ik} z_{kj}$ and $J$ being the number of basis functions in $\phi(s, t)$.

GrouPS also takes into account prior information about potential groupings of joints when searching for an optimal transformation matrix W. For the present robotic device two groups were used: the first group consists of the two fin-joints and the second group of the two base-joints. Thus, the symmetry of the design is exploited. The number of dimensions of the manifold was set to three and the rank parameter, controlling the sparsity and structure of W, to one. The outline of the algorithm can be found in Algorithm 1. Incorporating dimensionality reduction, periodicity, and information about the group structure yields a highly sample-efficient algorithm.

Algorithm 1: Outline of the Group Factor Policy Search (GrouPS) algorithm

Input: Reward function R (•) and initializations of parameters. Choose number of latent dimension n and rank r. Set hyper-parameter and define groupings of actions.
while reward not converged do
  for h=1:H do # Sample H rollouts
    for t=1:T do
      $a_t$ = WZϕ + Mϕ + Eϕ

-continued

Algorithm 1: Outline of the Group Factor
Policy Search (GrouPS) algorithm

```
|   |   |       with Z ~ N (0,I) and E ~ N(0,τ̄),
|   |   |       where τ̄^(m) = τ̄_m^{-1} I
|   |   |_  Execute action a_t
|   |_      Observe and store reward R (τ)
|   Initialization of q-distribution
|   while not converged do
|   |_      Update q (M), q (W), q (Z), q (α) and q (τ̄)
|   M = E_{q(M)} [M]
|   W = E_{q(W)} [W]
|   α = E_{q(α)} [α]
|_  τ̄ = E_{q(τ̄)} [τ̄]
Result:   Linear weights M for the feature vector φ,
          representing the final policy. The columns of
          W represent the factors of the latent space.
```

A Foldable Robotic Device

With the general methodology established, this section of the disclosure introduces the design of the robotic device. By necessity, the design also conforms to the constraints of the laminate fabrication techniques being employed—primarily that it is composed of a single planar layer. The salient aspects of Chelonioid morphology integrated into the present design are described below.

Biological Inspiration

The present design of the laminate robotic device was primarily inspired by the anatomy and locomotion of sea turtles. The present disclosure focuses on the terrestrial locomotion of adult sea turtles, rather than juveniles or hatchlings, emphasizing the greater load-bearing capacity and stability of their anatomy and behavior. There are seven recognized species in Cheloniodea in six genera. In spite of considerable inter-specific differences in morphology, all sea turtles use the same set of anatomical features to generate motion. Specifically, adult sea turtles support themselves on the radial edge of the forelimbs to (1) elevate the body (thus reducing or eliminating drag) and (2) generate forward motion. This unique behavior allows these large and exceedingly heavy animals (up to 915 kg in *Dermochelys coriacea*) to move in a stable and effective manner through granular media.

Robotic Device Design

Focusing on the turtle's forelimb for generating locomotion, the robot form and structure was determined within an iterative design cycle. In all designs, the body was suitably broad to prevent sinking during forward motion, and remained in contact with the ground at rest. This provides stability while removing the need for the limbs to bear the weight of the body at all times. A major benefit of this configuration is that only the two forelimbs are needed to generate forward thrust. Transmission of load occurs primarily under tension (as in muscles), to accommodate the laminate material and to provide dampening to reduce joint wear. The limbs have 2 rotational degrees of freedom, such that the fins move down and back into the substrate, while the body moves up and forward. This two degree of freedom arm was sufficient to replicate the circular motion of the fins (and particularly of the radial edge) observed in sea turtles.

Initial experiments attempted on early prototypes revealed a critical design flaw: the anterior end was prone to "plowing" into the substrate as shown in FIG. 5. This limitation was solved by mimicking two features of turtle anatomy. First, the apical portion of the design is shaped to elevate the body above sand, with an upturned apex, similar to upturned intergular and gular scales of the anterior sea turtle plastron. Second, the back end of the body was tapered to reduce drag (as compared to a rectangular end of equal length).

In the final design cycle, the robotic device sought to mimic and explore the morphology of the fins. Extant sea turtle species exhibit a variety of fin shapes and include irregularities seen on the outer edges, such as scales and claws. These features are known to be used for terrestrial locomotion by articulating with the surface directly (rather than being buried in the substrate). In order to understand how fin shape affects locomotion performance, we designed four pairs of fins: two generated from outlines of sea turtle fins which include all irregularities (*Caretta caretta* and *Natator depressus*, and two based on artificial shapes with no irregularities, as shown in FIG. 7. All of these were attached to the main body at a position equivalent to the anatomical location of the humeroradial joint (part of the elbow in the fin), and scaled to the width of the body. The arms of the robot were designed such that the fins can be interchanged at will, allowing for easy comparison of fin performance.

Experiments

An evaluation of the locomotion performance of the prototypes generated with our laminate fabrication process was conducted. In particular, the robustness to variations stemming from the terrain and manufacturing process, and the sensitivity to changes in the physical fin shape was evaluated.

More formally, there were three hypotheses that were experimentally evaluated:

H1 Group Factor Policy Search is able to find an improved locomotion policy—with respect to distance traveled forward—in a limited number of trials, despite the presence of variations in the rapidly prototyped robotic device and the environment.

H2 The shape of the fin influences the performance of the locomotion policy.

H3 The locomotion policies learned in the natural environment out-perform those learned in the artificial environment, when executed in the natural environment.

These hypotheses are tested through the following experiments.

Evaluation of Fin Designs

The experiment was designed to evaluate the effectiveness of locomotion policies generated for the four types of fins described herein. Five independent learning sessions were conducted for each fin, consisting of 10 policy search iterations each for a total of 1050 policy executions per fin. The experiment was performed in an indoor, artificial environment utilizing poppy seeds in which sand was substituted for with a granulate material—which is less abrasive and increases the longevity of prototypes. Human involvement, and thus randomness, was minimized during the learning process by employing an articulated robotic arm (UR5). This arm was responsible for placing the robotic device under test in the artificial environment prior to each policy execution, then subsequently removing it and resetting the environment with a leveling tool. This sequence of actions is depicted in FIGS. 6A-D.

The policy search reward was automatically computed by measuring the distance (in pixel values) that a target affixed to the robot traveled with a standard 2D high-definition webcam. This was computed from still frames captured before and after policy execution. After learning, the mean iteration policies were manually executed and measured in order to produce metric distance rewards for comparison.

Policy Learning in a Desert Environment

Figure 9:
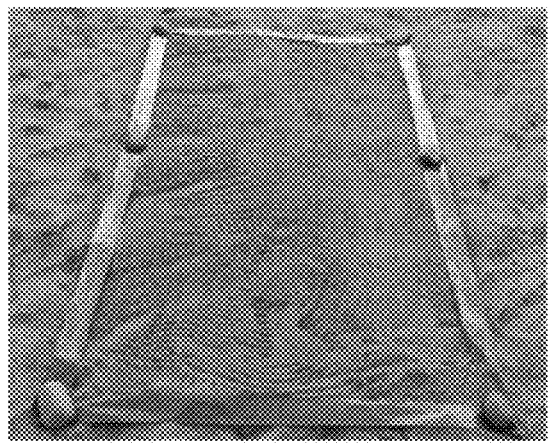
FIG. 9 is a picture of a testbed in the Arizona desert used for evaluating and learning policies in a real environment, according to aspects of the present disclosure.

The second experiment was designed to test how well policies transfer between these environments, and whether policies learned in-situ are more effective than policies learned in other environments. Over the course of two days, the policies generated for each fin in the artificial environment from the first experiment were executed in a desert environment in the Tonto National Forest of Arizona in order to measure their distance rewards. A flattened test bed was created as shown in FIG. 9, rather than using untouched ground, in order to reduce locomotion bias due to inclines, rocks, and plants.

Furthermore, two additional learning sessions were conducted for fins A and C in the same test bed in order to provide a point of comparison. To maintain consistency with the first experiment, learning was performed with 10 Policy Search iterations and reward values were measured via camera. Manually measured distance values for each mean iteration policy were obtained after learning. A video of the learning process and supplementary material can be found on c-turtle.org.

Results

Figure 8A:
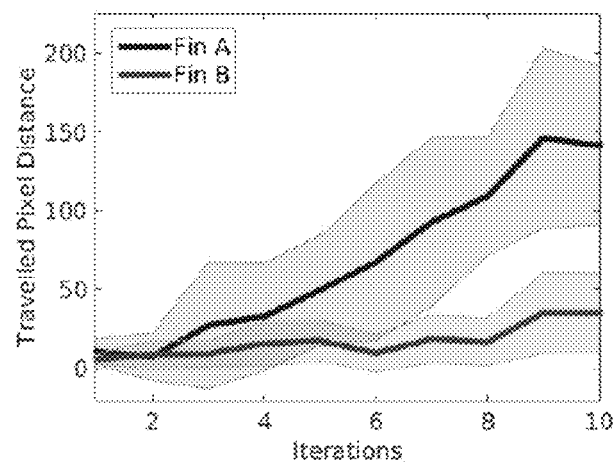
FIGS. 8A-8C are graphical representations showing a comparison between the learning for different fin designs of the robotic device, according to aspects of the present disclosure.
Figure 8B:
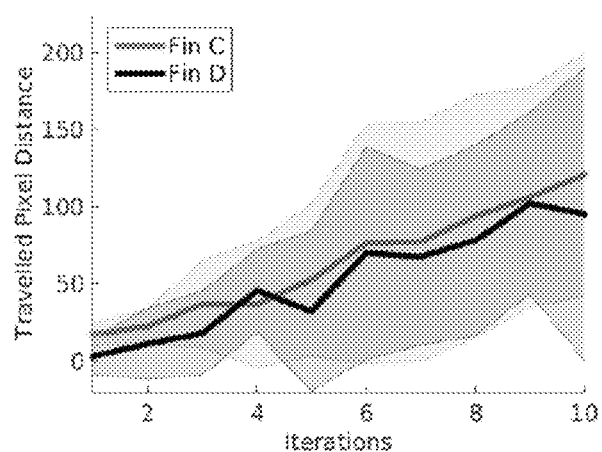
Figure 8C:
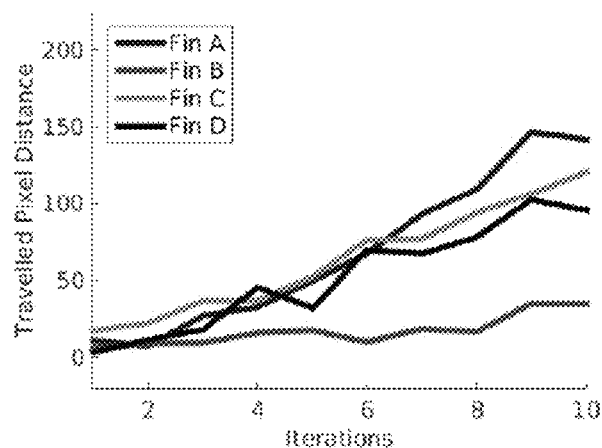
Figure 10:
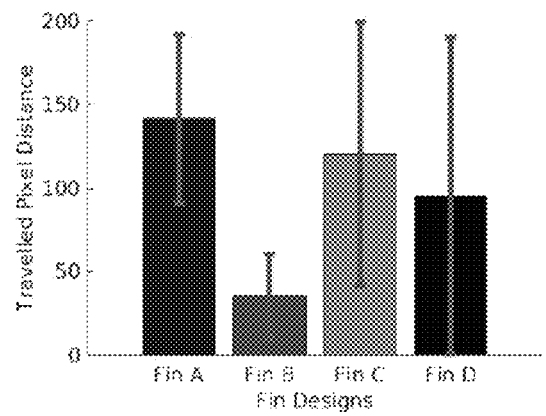
FIG. 10 is a graphical representation of the mean and standard deviation of policies for each fin design in the last iteration of the learning process, according to aspects of the present disclosure.

The rewards achieved by policies learned on poppy seeds are presented in FIGS. 8A-C with their mean and standard deviation over the conducted experiments. FIG. 8A compares the biologically inspired fin A (*C. caretta*) and the simple rectangular shape. The second biologically inspired fin C (*N. depressus*) and the artificial oval fin can be found in FIG. 8B, both with a similar performance. The mean values of the learned policies are given in FIG. 8C. The reward in these plots is given as pixel distances, as recorded by the camera, covered by the robotic device with its movement, which means that fin A (*C. caretta*) outperforms all other fin designs. On the opposite, the rectangular shaped fin shows the worst performance. This can also be seen in FIG. 10 which compares the mean and standard deviation of achieved rewards in the last iteration of the learning process between the four different fin designs.

Figure 11A:
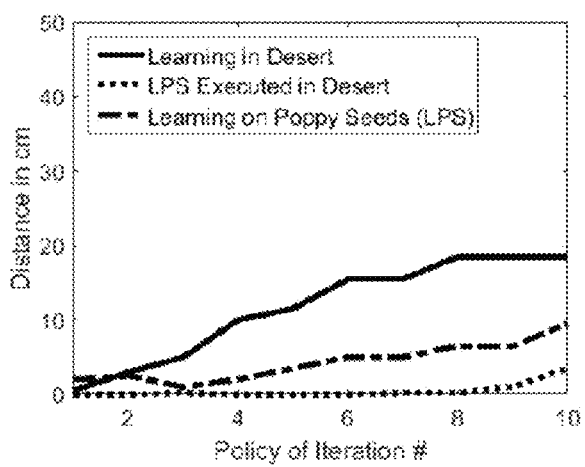
FIG. 11A is a graphical representation showing a comparison between policies learned for fin design C and FIG. 11B is a graphical representation showing a comparison between policies learned from fin design A, according to aspects of the present disclosure.
Figure 11B:
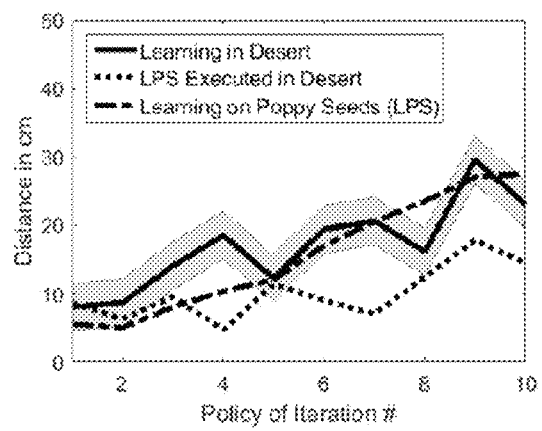

Two different fin designs, A (*C. caretta*) and C (*N. depressus*), were selected for the comparison between policies learned on poppy seeds and policies learned in a natural environment. FIGS. 11A and 11B show the covered distances in centimeters for policies learned and executed on poppy seeds as well as executed in the desert for each iteration. The third policy for each fin was learned and evaluated in the desert. It can be seen that the policy learned in the natural environment outperforms the policies learned on the substitute in the laboratory environment.

Figure 12A:
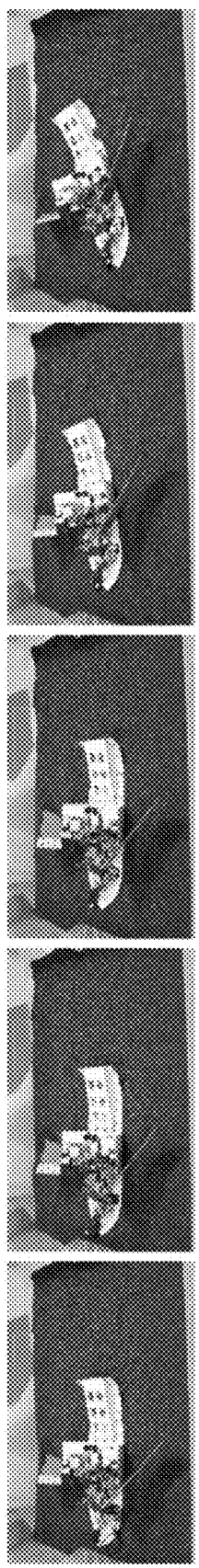
FIGS. 12A-12C show sequences illustrating executions of learned policies on poppy seeds and in a real desert environment, according to aspects of the present disclosure.
Figure 12B:
Figure 12C:
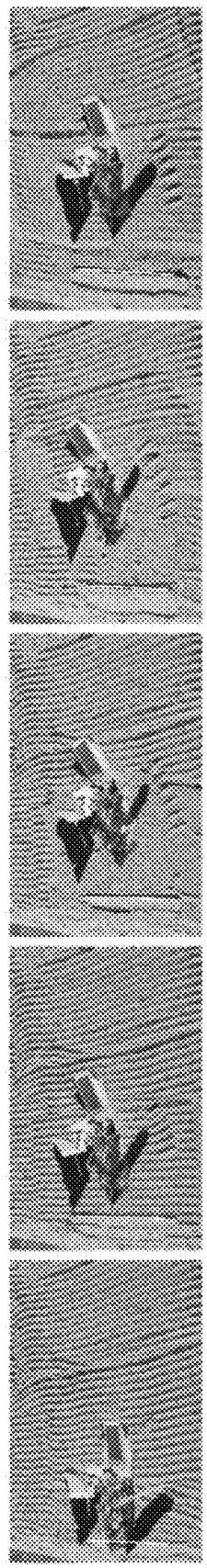

A series of images from the executions of the policies are shown in FIGS. 12A-C. The pictures show the final position after execution of policies learned in iteration one, four, six, eight and ten. The images in FIGS. 12B and 12C show the difference in covered length between policies learned on poppy seeds and the policies learned in the natural environment.

Discussion

The results shown in FIG. 8 and FIG. 11 indicate that for every fin that underwent learning, in both artificial and natural environments, the final locomotion policy shows some degree of improvement with regard to distance traveled by the robot after only 10 iterations. This supports hypothesis H1 which postulated that Group Factor Policy Search would find an improved locomotion policy in a limited number of trials, despite variations in the environment and fin shape.

However, the results also indicate that some fins clearly performed better than others. For example, fin B only achieved a mean pixel reward of 35.2 in the artificial environment, while fin A saw a mean pixel reward of 141.8, as shown in FIG. 8A. This supports H2, which hypothesized that the physical shape of the fin affects locomotion performance.

It is interesting to note that the biologically inspired fins (A and C) out-performed the artificial fins (B and D) on average. At least part of this may be due to the intersection of the fin and the ground when they make contact at an angle, as is the case in our robotic design. The biological fins have a curved design which increases the surface area that is in contact with granulate media when compared to the artificial fins while the overall surface areas of artificial fins and biologically inspired fins are comparable to each other. Furthermore, fin B exhibited significant deformation when in contact with the ground which likely reduced its effectiveness in producing forward motion.

The results shown in FIG. 11 support hypothesis H3, in that policies learned in the natural environment outperform the policies that were learned in the artificial environment. The inventors reason that part of this discrepancy is due to the composition of the granulate material. The poppy seeds used in the artificial environment have an average density of 0.54 g/ml with a—qualitatively speaking—homogeneous seed size, while the sand grains in the desert have an average density of 1.46 g/ml and a heterogeneous grain size. These results indicate that artificial environments consisting of popular granulate substitutes, such as poppy seeds, may not yield performance comparable to the real-world environments that they are mimicking. Thus, it is not only simulations that can yield performance discrepancies, but also physical environments.

Additionally, we observed that the composition of the natural environment itself fluctuated over time. For instance, we measured a difference in the moisture content of the sand of nearly 82% between the two days in which the experiments were performed: 1.59% and 0.87% by weight. These factors may serve to make the target environment difficult to emulate, and suggest that not only are discrepancies possible between simulated environments, artificial environments, and actual environments, but also between the same actual environment over time. It is suspected that lifelong learning might be a possible solution to this problem.

Figure 13:
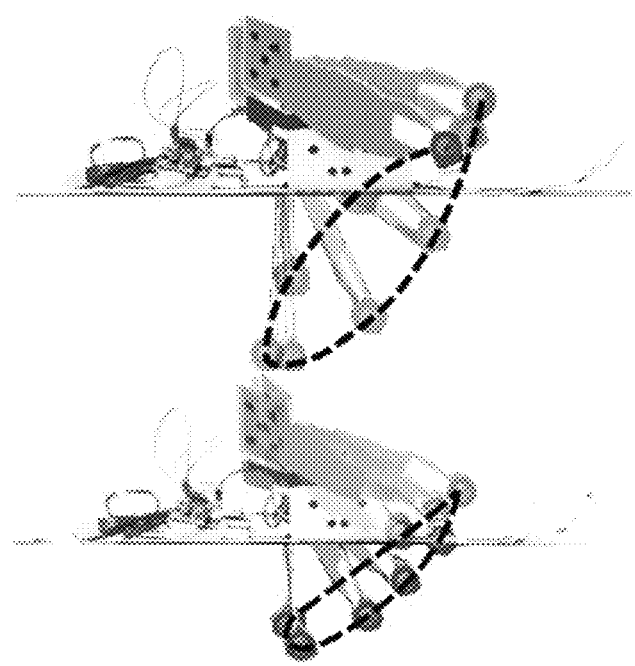
FIG. 13 are illustrations showing the gait produced by the right fin after iteration 10 and iteration 3 with fin A, respectively, according to aspects of the present disclosure.

Yet another interesting observation can be made from the gaits shown in FIG. 13. The cycle produced by the fin during a more effective policy extends deeper and further than that produced during a less effective policy. Intuitively, we can reason that this more effective policy pushes against a larger volume of sand, generating more force for forward motion.

Figure 14:
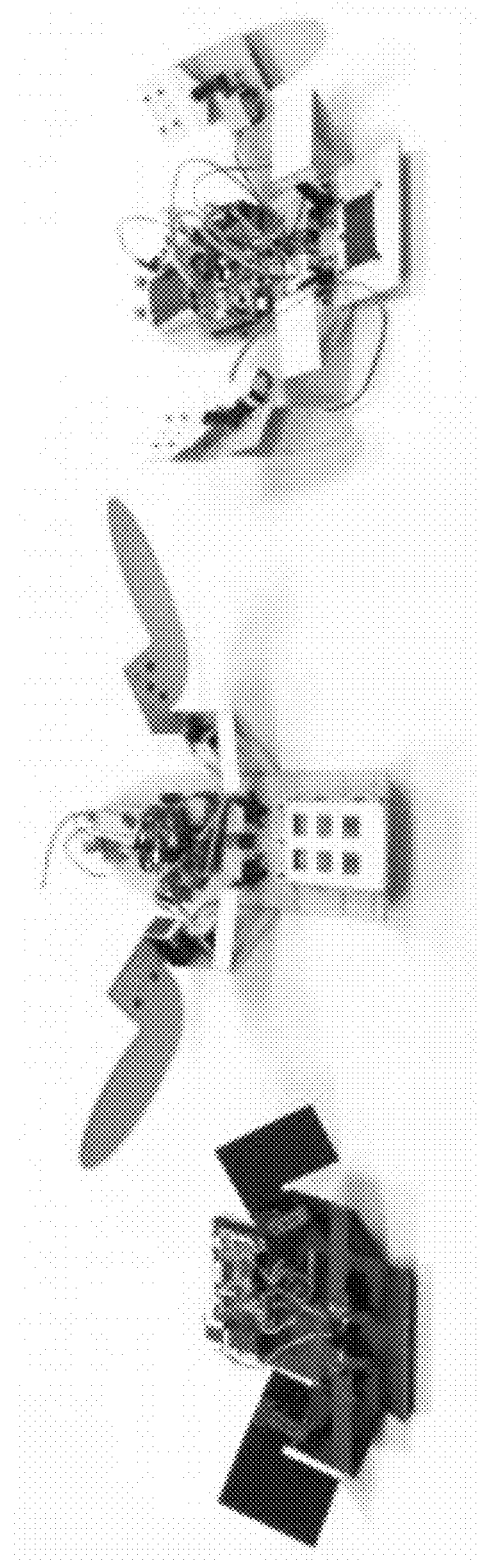
FIG. 14 is a picture showing three different versions of the robotic device, according to aspects of the present disclosure.
Figure 15:
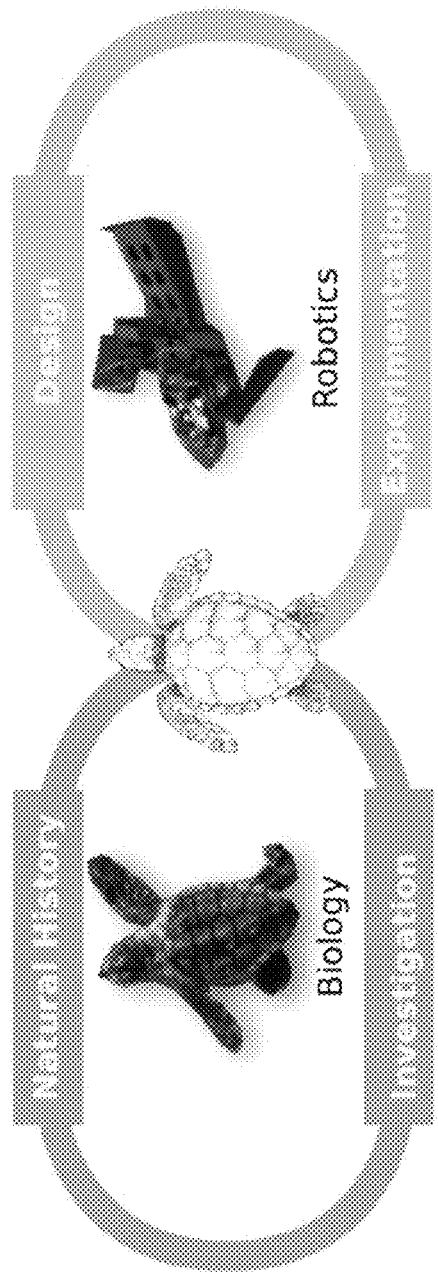
FIG. 15 is an illustration showing the workflow and design cycle for biomimicry, according to aspects of the present disclosure.

Bio-Inspired Robotic Design Considering Load-Bearing and Kinematic Ontogeny of Sea Turtles An embodiment for a robotic device based on bio-inspired robotics is shown in FIG. 15, where design inspiration was drawn from biological systems, and then the resulting prototype was used as a physical, manipulable analogue to further investigate the properties of that system. Using this theoretical framework, the present disclosure explores the ontogenetic differences in sea turtle morphology and locomotion using a crawling robot as a bio-analogue. The present disclosure outlines in detail (1) the implications of the natural history of sea turtles for our design, and (2) the implications of the observed experimental performance of the robot for sea turtle biology. This process is made possible through the design and fabrication of a robotic device analog which permits us to explore the connection between morphology, load-carrying capacity, and performance on a simplified system which can be thoroughly and repetitively tested (FIG. 14).

Background: Movement of Turtles

The selection of sea turtles is motivated by three aspects of their locomotion that the inventors identified as promising for this particular application. First, sea turtles are capable of effective movement through unstable media, without loss of traction or sinking; the broad surface area, upturned plastron, and "crutching" motion of the body and fins avert sinking or digging into the substrate, preventing the animal from getting stuck under normal conditions, Secondly, the low center of mass of the turtle and intermittent contact with the ground make the body inherently stable and difficult to overturn; as such, only two limbs are needed to generate forward thrust, making this form of locomotion simple to mimic, easy to manipulate, and amenable to our laminate manufacturing approach. Finally, the unique kinematic behavior of sea turtles can either enable rapid movement of the hatchlings or permit the large and exceedingly heavy adults [up to 915 kg in Dermochelys coriacea to move more slowly through granular media, but under considerable load.

While there are many differences between species, terrestrial locomotion of sea turtles does exhibit some common variation as a function of development, especially when comparing the hatchling and adult phases of life. During the hatchling phase, the young, comparatively lightweight turtles favor speed over load-bearing capacity to escape predation. In particular, terrestrial locomotion in hatchlings is characterized by use of the palmar and plantar surfaces of the limbs to compact loose media to generate forward motion, with the arms relatively straight. Compared to adults, hatchlings have more flexible fins to induce substrate compaction while minimizing limb slippage. Furthermore, the body shape of hatchling sea turtles is comparatively narrow, and proportionately lighter than adults, with relatively long limbs; their morphology and gait permits some species to elevate the body fully above ground during motion.

By contrast, the older, proportionately sturdier, adult turtles move more slowly, especially in heavier species. Adult Chelonioid terrestrial locomotion is generally characterized by the use of the humerus and radial edge of fin to elevate and advance the body, as if moving on crutches. This occurs with alternating ventral extension and flexion of the humerus, while the radius remains at an approximate 80-90° angle to the humerus, thus crawling on the elbows. Paired movement of bath forelimbs in this 'crutching" motion elevates center of mass to reduce friction. Compared to hatchlings, the fins of adult sea turtles are much stiffer, more muscular, and comparatively shorter for swimming. This fin morphology, combined with the relatively broad body and paired forelimb motion, greatly reduces the speed of terrestrial locomotion in adults, but enables them to carry a much heavier load. Juveniles, although rarely observed on laud, have been documented using either of these gaits (with no known intermediate state); adults learn unique swimming and crawling gaits to compensate for developmental differentiation in the fins, which become optimized for hydrodynamic propulsion.

It is believed that the observed decrease in relative speed and increased load-bearing capacity of terrestrial locomotion of adult sea turtles are the result of using a shorter lever arm (palm is distal to humerus) to elevate and advance the body. In this case, the shorter moment arm provides more direct support of center of mass due to the position of humerus; conversely, the longer moment arm of the hatchling fins provides greater apical velocity. From these observations, we predict that a sand crawling robot can be modified to maximize its load-bearing capacity or velocity by changing the design of its fins to mimic these particular aspects of sea turtle ontogeny. Hatchlings are known for their high energetic needs for rapid escape to the ocean during "hatchling frenzy". However, it is unknown whether the energy efficiency of these competing forms of locomotion are influenced by their kinematic properties or are determined solely by age, size, and muscle development. The issue of optimizing motion under load for travel distance and energy consumption is critical in battery operated robots.

Based on the reasoning and biological observations presented above, the following hypotheses were evaluated: 1) In keeping with the results of Mazouchova et al., the inventors hypothesized that limb flexibility aids in substrate compaction and enhances forward motion. 2) The inventors further hypothesized that rotation of the limb about the humeral angle with age, as seen in adult locomotion, reduces the moment arm of the forelimb, increasing load bearing capacity at the expense of velocity. 3) Given the shorter moment arm of the forelimbs, it was hypothesized that adult style locomotion will be more energy efficient than that of hatchlings.

Design and Fabrication of the Robotic Sea Turtle

Figure 16A:
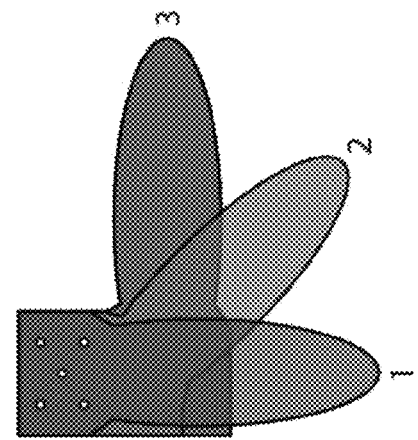
FIG. 16A is a schematic view of an embodiment of the robotic device inspired by sea turtles and FIG. 16B is an illustration that highlights three different fin designs tested on the robotic device, according to aspects of the present disclosure.
Figure 16B:
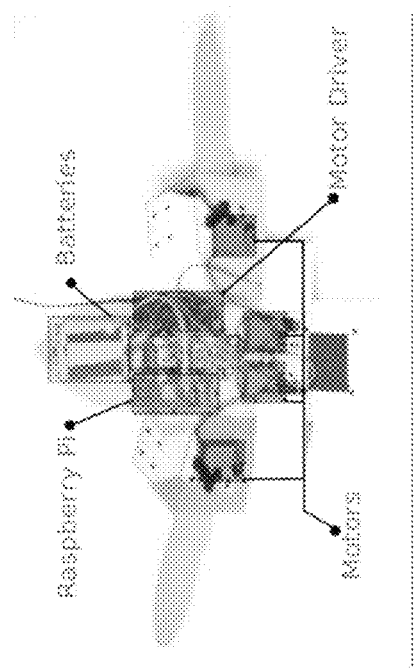

To test their hypotheses, the inventors were able to mimic the change in fin orientation and usage seen during sea turtle development using a turtle-inspired robot which uses three detachable fin designs, where an ellipsoid representing the fin is rotated about the lateral angle of the attachment point, as seen in FIG. 16B with each design roughly corresponding to a specific developmental state. 1) The first design was an unrotated (longitudinal) ellipsoidal fin that mimics the relatively straight hatchling fin configuration. 2) The second fin design is identical in shape to the first, but is rotated of laterally by 90° (transverse). This rotation created an L-shaped base that is similar to the humeral angle of adult sea turtle fins during crawling. 3) The third design was a fin rotated laterally by 45° (diagonal). This configuration does not correspond to any known position adopted by a sea turtle, but rather, simulates an ad-hoc intermediate configuration between the two previous states. The length and width of the fins was standardized such that the ratio of fin length to body width was equal to that of an adult Caretta caretta (Linnaeus, 1758), for experimental consistency and to avoid having to redesign the body.

For each fin design, the inventors developed a predictive kinematic model to examine what differences in motion and fin shape might have affected their experimental trajectories. In the experiments, heavier loads were successively applied to the crawler to assess fin performance with a hand-coded controller. In particular, the total distance traveled was measured with two repetitions of fin motion while (1) varying the angle of the fin in relation to the body, (2) changing the composition and stiffness of the fins, and (3) imposing a load either on the front or back end of the robot. Power consumption for the adult and hatchling inspired fins was additionally measured to address the third hypothesis. Based on these results, the implications of the data were considered as a physical analogue for understanding the ontogeny of terrestrial locomotion in Chelonioidea, and briefly explore possible design changes to allow our robot to dynamically respond to imposed loads via alteration of fin angle.

Kinematic Modeling

Figure 17A:
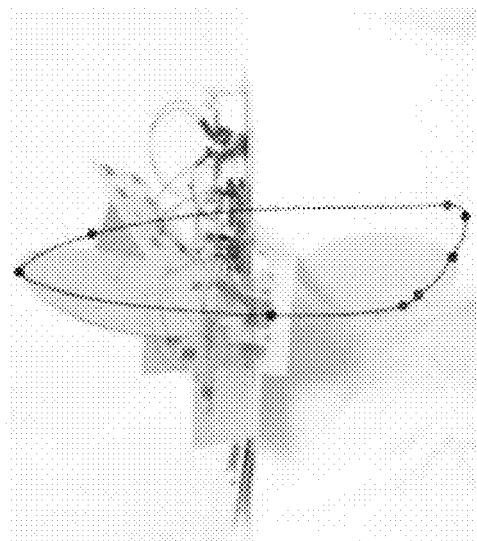
FIG. 17A is an illustration showing lateral views of an apical fin motion for the hatchling inspired longitudinal fin and FIG. 17B is an illustration showing lateral views of an adult inspired transverse fin, according to aspects of the present disclosure.
Figure 17B:
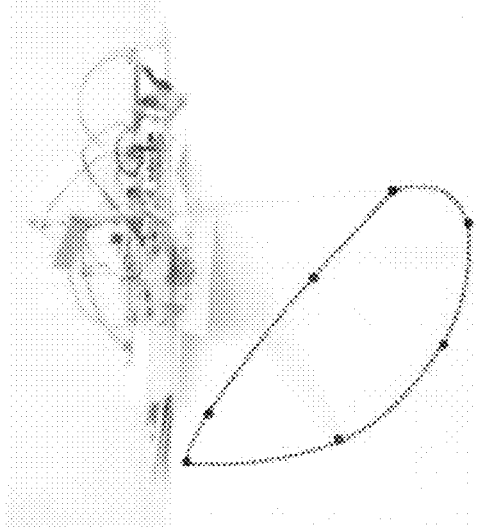
Figure 18A:
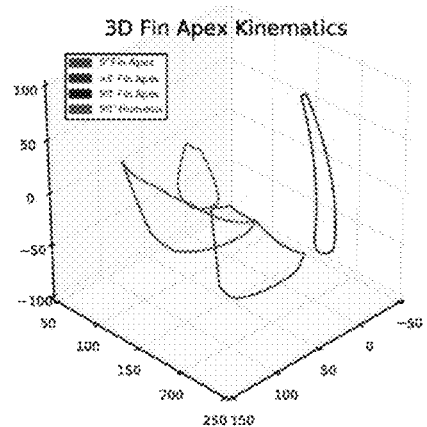
FIG. 18A is a graphical representation of three-dimensional motion of a port fin apex, viewed laterally from the robotic device mid-line.
Figure 18B:
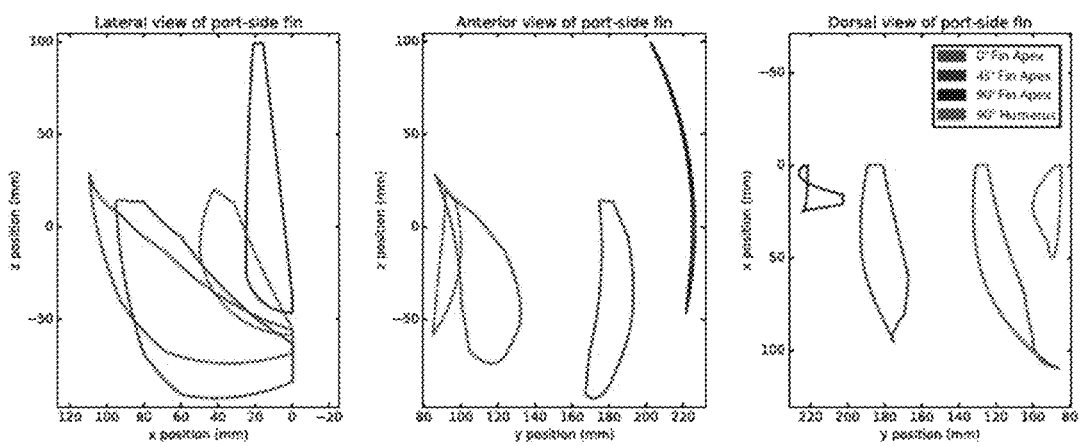
FIG. 18B is a graphical representation of the motion of a port fin apex through the entire stroke viewed from lateral, anterior, and dorsal views, respectively.

Explicit kinematic models were generated based on the paired four-bar mechanisms (FIG. 16A) used to elevate the arm of CTurtle robotic device and actuate the fin, which are reasonably accurate compared to the actual motion moored in FIGS. 17A and 17B These models (FIGS. 18A and 18B) show a shortened fulcrum based on fin rotation about the lateral attachment point, especially for the transverse fin. FIG. 18B clearly shows in the lateral (see also FIGS. 17A and 17B) and anterior views that the humeral angle of the transverse fin penetrates the substrate (ground at z=0) at approximately ⅔ of the depth attained by longitudinal fin, and with only ½ of the maximum forward stroke length.

Figure 18C:
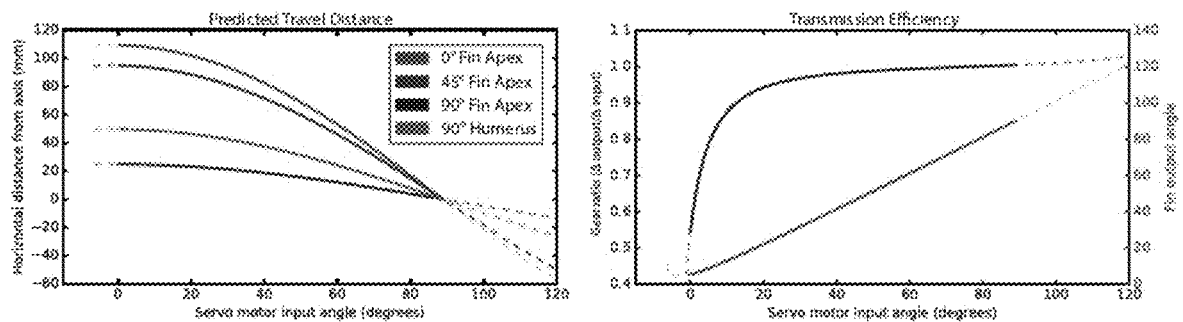
FIG. 18C is a graphical representation of the output angle of a port fin with respect to arm-mounted servo (fin motor) as well as gear ratio of a 4-bar mechanism to which the represented angles belong, according to aspects of the present disclosure.
Figure 19A:
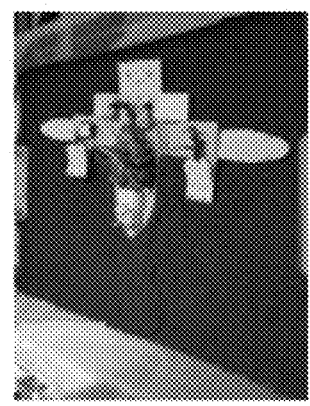
FIGS. 19A-D are pictures showing the final position after the execution of two complete gait cycles with different additional weights carried by the robotic device in which a transverse fin design is used and FIGS. 19E-H are pictures showing the final position after the execution of two complete gait cycles with different weights carried by the robotic device in which a longitudinal fin design is used, according to aspects of the present disclosure.
Figure 19B:
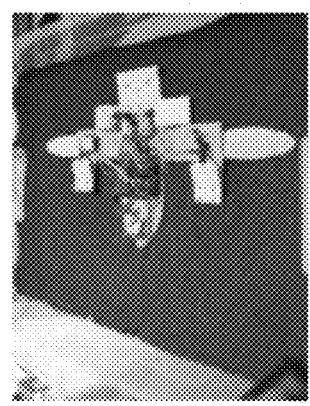
Figure 19C:
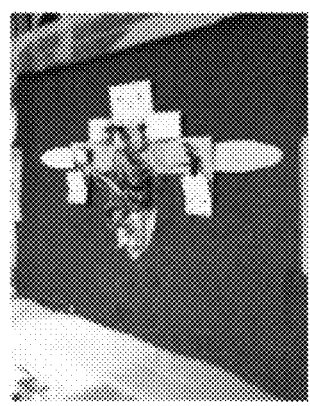
Figure 19D:
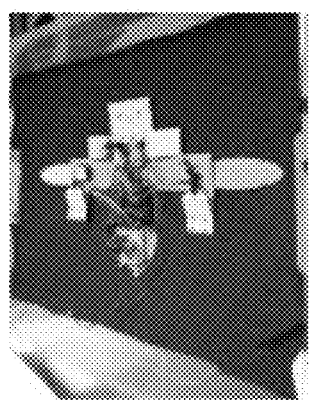
Figure 19E:
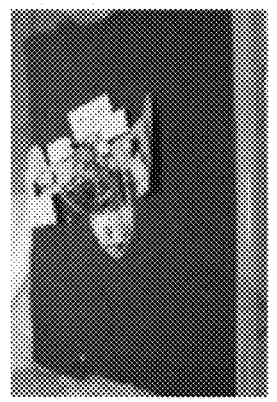
Figure 19F:
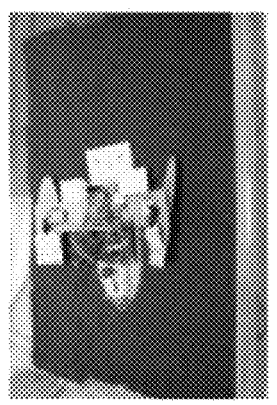
Figure 19G:
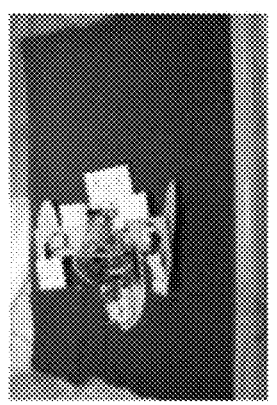
Figure 19H:
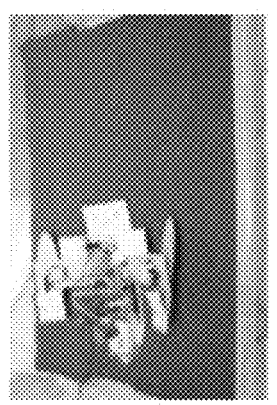

The open-loop controllers used to generate the motor commands were hand-designed sinusoidal functions offset by 180° to allow sweeping of the fin during the downstroke of the arm, followed by resetting of the fin during the arm upstroke. The sweeping angles of the fin and total identical number of commands given to each motor for each fin design were identical; the time per command and total time per cycle were also identical for each motor and between fin designs (i.e. radial velocity). Thus, rather than try to calculate velocity, the present disclosure refers to distance traveled per cycle, because each cycle uses the same number of angle commands and uses the same amount of time. In addition, because all fin designs use exactly the same span of angles during the compression of substrate, the inventors were able to effectively eliminate the effect of varying gear ratio as a possible confounding effect on force transmitted to substrate. The importance of this consistency can be seen in FIG. 18C, which shows that transmission efficiency (with respect to gear ratio) increases with motor angle, providing more effective compression of substrate as the stroke progresses.

The only difference was the magnitude of the downstroke, which was adjusted for each fin design to maximize ground penetration and distance traveled, while minimizing back-plowing of the substrate on upstroke. Consequently, in the longitudinal fin, compression of the substrate occurred near the fin apex, similar to hatchling sea turtles. In the transverse fin, substrate compression happened more evenly along the radial edge of the fin and especially near the extended basal portion (analogous to the humeral angle), similar to adult sea turtles.

These kinematics imply that, compared to the longitudinal fin, the transverse fin has shorter (FIG. 18C), shallower strokes, with comparatively low apical velocity (due to shorter effective radius of the fin). However, due to the shorter moment arm that creates this pattern, transverse fin was predicted to provide greater force per stroke, and reduced lifting of the body, given the posterior arrangement of components (FIG. 16A). Given the reduced lifting, we predicted greater energy efficiency for transverse fin, due to reduced energy wasted on upward motion.

Experiments

Two different experiments were conducted to investigate the hypotheses discussed herein. The first experiment was designed to evaluate hypothesis 1 by measuring the locomotion performance of CTurtle robotic device with fins of different stiffness. The second experiment addressed hypotheses 2 and 3 by measuring locomotion performance and energy efficiency of fins with varying rotational angle inspired by their biological counterparts.

Experimental Setup

All experiments were conducted using the CTurtle robotic device shown in FIG. 16A. In order to guarantee reproducibility of results, the robotic device was powered with an external 5V, 2 A power source as opposed to the onboard batteries in the schematic. Experiments were performed in a simulated sand environment consisting of poppy seeds in order to avoid the detrimental effect that actual sand has on equipment. The similar granularity between poppy seeds and sand makes it a suitable replacement, despite the difference in density −0.54 g/ml to 1.46 g/ml, respectively. Unlike previous work, the motor commands for a gait cycle were derived from a hand-coded combination of sinusoidal functions with a shift of 180° between the functions for vertical and horizontal movements. Joint angles relative to the middle position are given by $$a_{1,4} = \cos\left(180° + \frac{t}{T} \cdot 360° \cdot 2\right) \cdot 60,$$

$$a_{2,3} = \sin\left(180° + \frac{t}{T} \cdot 360° \cdot 2\right) \cdot m + o$$

with $a_{1,4}$ being the joint angles for horizontal movements and $a_{2,3}$ being joint angles for vertical movements. For each of the three different fin designs the vertical movements were adapted to achieve an optimal movement for each fin design with no additional load. For both longitudinal and intermediate fins, the magnitude m was 20 while the transverse required a magnitude of 60 to lift the fin high enough. The offset o for the longitudinal, intermediate and transverse were 10, −15 and −40, respectively.

Measuring the Effect of Fiberglass Reinforcement

For this experiment, two sets of fins were created that vary in rigidity. Flexible, pliant fins were created with a 3-layer laminate consisting of two 6-ply paper layers held together by a 1-ply adhesive layer. Rigid fins were created by reinforcing the 3-layer laminate design with two additional layers of a fiberglass coating (as well as two additional adhesive layers) resulting in a 7-layer laminate. Each set consists of a longitudinal fin and a transverse fin (FIG. 16B) in order to determine whether rigidity performance is affected by the rotational angle of the fin.

The fins were evaluated by attaching them to CTurtle robotic device and measuring how far it traveled in the simulated sand environment after executing two complete gait cycles. Each evaluation was performed five times to capture the mean and standard deviation. This process was repeated for load weights varying from 0 g to 100 g, with the weight placed near the front of the robot.

Evaluating Performance of Different Fin Angles

For the second experiment, the travel distance of CTurtle robotic device was measured again in a simulated sand environment, but for all fin designs (FIG. 16B) and for a larger range of load weights. Furthermore, this experiment explored the effect of center of mass on locomotion performance. Evaluations were performed with weights varying from 0 g to 300 g placed at the rear of the robot—in effect moving the center of mass to the rear of CTurtle robotic device—and again with weights varying from 0 g to 200 g placed at the front of the robotic device—forcing the center of mass further forward. All evaluations were performed with rigid, fiberglass-reinforced fins for two complete gait cycles and five repetitions.

An additional set of evaluations was performed to test the energy efficiency of the transverse fin and longitudinal fin designs. The current consumption of all four motors powering CTurtle's limbs were measured with a DC current sensor operating at 60 Hz while two complete gait cycles were executed. The mean and standard deviation for three repetitions were captured.

Results

Figure 21A:
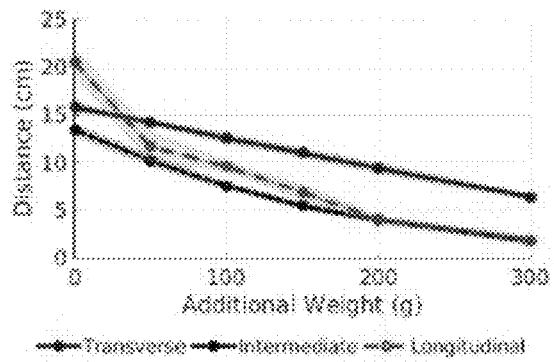
FIGS. 21A-E are graphical representations showing the performance of the robotic device of FIG. 16A, according to aspects of the present disclosure.
Figure 21B:
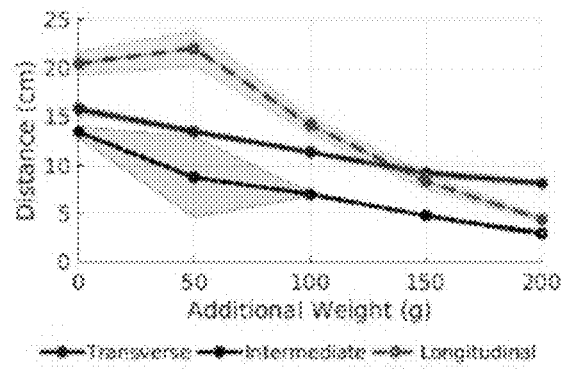
Figures 21C, 21D:
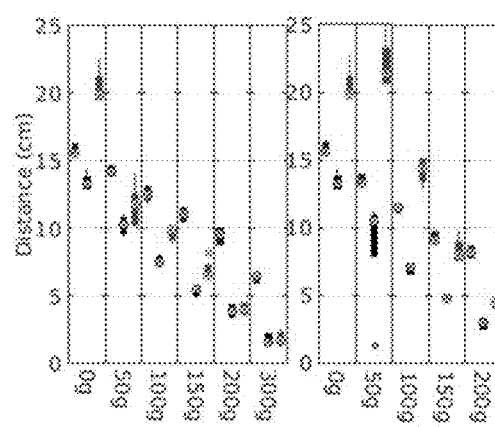

The results of the first experiment, shown in FIGS. 20A-C indicate that the rigid, fiberglass-reinforced fins yield longer travel distance than the flexible, paper fins across all tested loads. The results for the second experiment are shown in FIGS. 19A-H and 21A-E which shows that the transverse fin configuration enables CTurtle robotic device to travel longer distances than the other fin designs with a heavier load. The longitudinal fin design yields the greatest distances for low loads, however, the performance degrades more rapidly than that of the longitudinal fin design with an increasing load, falling behind when the load is 50 g (FIG. 21A) or 150 g (FIG. 21B) depending on the center of mass. The intermediate fin design performs the worst, yielding the shortest traveled distance for all but the highest loads.

Figure 21E:
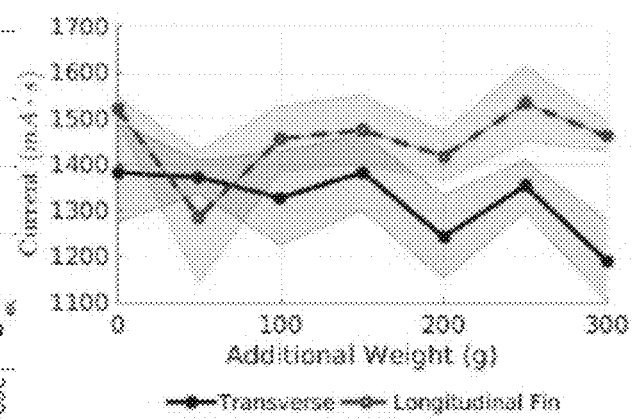

Another interesting remit is the measured current consumption for the different fin designs, as shown in FIG. 21E. The transverse fin yielded lower current consumption as the additional rear-weight increased, reaching a low of 1191 mA's for 300 g of additional weight. The longitudinal fin, on the other band, dis, played an increasing current consumption trend as the rear-weight increased with 1462 mA·s at the same weight; this is approximately a 22% increase over the transverse fin at the maximum tested load.

Discussion

The results demonstrate that fiberglass reinforcement of the fins indeed leads to improved locomotion, as indicated by a substantial increase in the distance traveled per stroke (FIGS. 20A-C). In the robot, fin flexibility is detrimental to loco-motor output, which is not fully aligned with the results of Mazouchova et al., where a flexible wrist aided in granule compaction, thus enhancing motion. Most likely this is due to the entire fin being uniformly flexible in our experiment, rather than flexing along joints or having alternating stiff and compliant regions due to varying distribution of muscles and bones in actual fins.

Under imposed load, the longitudinal fin travels a greater distance per stroke than the transverse fin. The superiority of the longitudinal fin ends after adding a mere 50 g of additional weight at the back of the robot. Interestingly, the longitudinal fin travelled further with the addition of 50 g to the front end; we believe that the imposed load caused decreased lifting of the front end, leading to earlier fin contact with the ground in each movement cycle. However, even with this increase, the performance of the transverse fin overtakes the longitudinal fin after the addition of 150 g. The inventors surmise that this happens due to differences in the length of the lever arm, which is considerably shorter in the transverse fin (see FIG. 18B). A comparatively long lever arm contributes to per-stroke travel distance at the expense of energy efficiency and load-bearing capacity.

On the design side, these results imply that even a slight increase of battery capacity will require the use of the transverse fin for effective locomotion unless weight redistribution is considered. In general, the results suggest that improved locomotion and energy efficiency is possible with anterior redistribution of battery weight. This, in turn, could be the input into the next iteration of the proposed design pipeline.

In addition to possibly informing future decisions within the next design cycle, these differences in locomotive performance can improve our understanding of sea turtle biology. Hatchling sea turtles have longer limbs in proportion to their body, and, more importantly, compact substrate at a more distal location (palmar surface) on the fore-limbs than adults. This gives them a longer moment arm at the shoulder joint (scapula to palmar surface). Based on these results, an elongate moment arm and relatively low weight should enable hatch lings to cover ground at a higher velocity per stroke than adults, before considering gait. A comparison of the energy consumption rates of the different fins suggests that this may occur at the expense of increased energy expenditure compared to adults; this observation is supported by high lactic acid production (for rapid energy production) characteristic of hatchling metabolism.

Adult sea turtles compact substrate and support their body weight at the anatomical equivalent of the elbow, and have proportionately shorter fins than hatchlings (scapula to humeral angle). With the transverse fin, the robotic device was able to move substantially heavier loads across the substrate than with the longitudinal fin, apparently at a considerable cost-savings in energy consumed per movement cycle (approx. 20% at 300 g). Per-cycle energy expenditure decreases with increased load with the transverse fin, but increases with load using the longitudinal fin. Notably, this appears to be an intrinsic advantage due to fin morphology rather than purely a result of gait asymmetry (paired motion of forelimbs) as all sets of fins utilized an asymmetric gait in our experiments. It was therefore inferred that by propping up the body with both forelimbs and using the humerus to bear weight, adult sea turtles are able to carry a heavier mass (relative to body size) than their immature counterparts.

Surprisingly, a fin rotated at an intermediate angle of 45° was inferior to both of the other fins in distance traveled and load-bearing capacity. The 45° rotation would approximately correspond to an enforced 45° abduction of the humerus; this configuration is not known to be used in sea turtle locomotion. However, the inferior locomotive capabilities of this arm position suggest that this might not exist at all because its use would result in poor performance. Although energy consumption data for the intermediate fin was not collected, the inventors posit that anatomically this position would be disadvantageous and would require the arm to actively support the body using constant tension of the pectoralis major rather than passive support on the rigid humerus. This finding corroborates hypotheses reported in the literature that adult gaits are learned after reaching developmental thresholds of fin differentiation and weight gain.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A robotic device, comprising:
   a body, the body formed from a substrate comprised of a plurality of layers; and
   a plurality of limbs formed from the substrate and arranged along the body, including:
     a first limb in operable engagement along a first lateral side of the body, the first limb defining a first fin,
     a second limb in operable engagement along a second lateral side of the body opposite the first lateral side, the second limb defining a second fin,
     wherein the plurality of limbs are configured such that during operation a radial edge of the first fin and the second fin articulates with a ground surface, wherein operation and orientation of the plurality of limbs relative to the body is configured based upon a sample-efficient reinforcement learning method that considers changes to the robotic device and environment and leverages low-dimensional nature and periodicity of locomotion gaits to learn control policies for the robotic device that adapt to the ground surface, and wherein the body and the plurality of limbs are configured with optimal locomotion policies generated using a Group Factor Policy Search algorithm modified with a periodicity constraint, wherein the Group Factor Policy Search algorithm is modified with a periodic feature function that enforces the periodicity constraint onto the locomotion policy, and further incorporates dimensionality reduction and information about group structure.

2. The robotic device of claim 1, wherein the substrate is formed with flexure-based hinges created through selective removal of rigid material along predetermined bend axes.

3. The robotic device of claim 1, wherein the plurality of limbs include two rotational degrees of freedom relative to the body, such that during forward movement of the robotic device the first fin and the second fin move down and back into the body as the body moves up and forward.

4. The robotic device of claim 1, wherein the first fin and the second fin are curved.

5. The robotic device of claim 1, wherein the body and the plurality of limbs form a general turtle-shape configuration such that a back end of the body is tapered, and an apical portion of the body is shaped to elevate the body above the ground surface with an upturned apex.

6. The robotic device of claim 1, wherein the first fin and the second fin are designed using a predictive kinematic model that analyzed differences in motion and fin shape and relative effects upon experimental trajectories.

7. The robotic device of claim 1, further comprising:
a plurality of open-loop controllers; and
a motor, the plurality of open-loop controllers used to generate motor commands for the motor which incorporate sinusoidal functions offset by 180 degrees to accommodate sweeping of the first fin and the second fin during down strokes of the plurality of limbs.

8. The robotic device of claim 1, wherein the plurality of limbs are rotated by 90 degrees relative to the body such that the robotic device defines a general L-shape resembling a humeral angle of an adult sea turtle fin during crawling.

9. The robotic device of claim 1, wherein the first fin and the second fin are formed using a multi-layered laminate comprising a plurality of paper layers and an adhesive layer.

10. The robotic device of claim 1, wherein the first fin and the second fin are formed using a multi-layered laminate comprising a plurality of paper layers, a plurality of adhesive layers, and a reinforcing fiberglass coating.

11. The robotic device of claim 1, wherein the first fin and the second fin are configured specifically for the ground surface and are interchangeable.

12. The robotic device of claim 1, wherein the substrate is formed as a single planar shape, and the body and the plurality of arms limbs are erected using predetermined cut-out portions of the substrate.

13. The robotic device of claim 1, wherein the sample-efficient reinforcement learning method is implemented using at least one computing device during testing of the robotic device and considers predetermined modifications to the plurality of limbs.

14. The robotic device of claim 1, wherein the substrate comprises a plurality of rigid layers sandwiched around a plurality of adhesive layers, the plurality of adhesive layers sandwiched around a polyester film.

15. The robotic device of claim 1, wherein the Group Factor Policy Search algorithm modified with the periodicity constraint models a control dimension $\alpha_i$ of the locomotion policy given a point at time t as:

$$a_i = \sum_j (\overline{w_{ij}} + m_{ij} + e_{ij}) \sin\left(\frac{t}{T}720° + \frac{j-1}{J}360°\right)$$

wherein the term $$\sin\left(\frac{t}{T}720° + \frac{j-1}{J}360°\right)$$

is associated with the periodic feature function and wherein the term $$\sin\left(\frac{t}{T}720° + \frac{j-1}{J}360°\right)$$

enforces the periodicity constraint on the control dimension of the locomotion policy for the point at time t.

16. A robotic device comprising:
a foldable body having a plurality of fins oriented along opposite lateral sides of the foldable body and operatively engaged to the foldable body, and
wherein the foldable body and the plurality of fins are configured with optimal locomotion policies generated using a Group Factor Policy Search algorithm modified with a periodicity constraint, wherein the Group Factor Policy Search algorithm is modified with a periodic feature function that enforces the periodicity constraint onto the locomotion policy and further incorporates dimensionality reduction and information about group structure.

17. The robotic device of claim 16, wherein the foldable body and the plurality of fins are made from a multi-layer composite laminate material.

18. The robotic device of claim 16, wherein the plurality of fins include a curved fin.

19. The robotic device of claim 16, wherein the foldable body is made from a material that has pliable portions.

20. The robotic device of claim 16, wherein the Group Factor Policy Search algorithm modified with the periodicity constraint models a control dimension $\alpha_i$ of the locomotion policy given a point at time t as:

$$a_i = \sum_j (\overline{w_{ij}} + m_{ij} + e_{ij}) \sin\left(\frac{t}{T}720° + \frac{j-1}{J}360°\right)$$

wherein the term $$\sin\left(\frac{t}{T}720° + \frac{j-1}{J}360°\right)$$

is associated with the periodic feature function and wherein the term $$\sin\left(\frac{t}{T}720° + \frac{j-1}{J}360°\right)$$

enforces the periodicity constraint on the control dimension of the locomotion policy for the point at time t.

* * * * *